(12) United States Patent
Peng

(10) Patent No.: US 10,867,910 B2
(45) Date of Patent: *Dec. 15, 2020

(54) SEMICONDUCTOR DEVICE WITH DAMASCENE STRUCTURE

(71) Applicant: TAIWAN SEMICONDUCTOR MANUFACTURING CO., LTD., Hsinchu (TW)

(72) Inventor: Tai-Yen Peng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/719,670

(22) Filed: Dec. 18, 2019

(65) Prior Publication Data

US 2020/0126909 A1 Apr. 23, 2020

Related U.S. Application Data

(63) Continuation of application No. 16/225,316, filed on Dec. 19, 2018, now Pat. No. 10,515,893, which is a continuation of application No. 14/459,808, filed on Aug. 14, 2014, now Pat. No. 10,163,778.

(51) Int. Cl.
| | |
|---|---|
| *H01L 23/522* | (2006.01) |
| *H01L 21/768* | (2006.01) |
| *H01L 21/8234* | (2006.01) |
| *H01L 23/532* | (2006.01) |

(52) U.S. Cl.
CPC .... *H01L 23/5226* (2013.01); *H01L 21/76804* (2013.01); *H01L 21/76885* (2013.01); *H01L 21/823475* (2013.01); *H01L 23/53223* (2013.01); *H01L 23/53238* (2013.01); *H01L 23/53252* (2013.01); *H01L 23/53266* (2013.01);

(Continued)

(58) Field of Classification Search
CPC ............ H01L 21/768; H01L 21/76802; H01L 21/76804; H01L 21/76877; H01L 23/481; H01L 23/528; H01L 23/5226; H01L 2225/026541

See application file for complete search history.

(56) References Cited

U.S. PATENT DOCUMENTS

| | | | |
|---|---|---|---|
| 5,567,270 A | 10/1996 | Liu | |
| 5,913,131 A * | 6/1999 | Hossain | ............ H01L 21/31625 438/423 |
| 7,495,340 B2 | 2/2009 | Kim | |

(Continued)

*Primary Examiner* — David C Spalla
(74) *Attorney, Agent, or Firm* — Birch, Stewart, Kolasch & Birch, LLP

(57) ABSTRACT

A semiconductor device structure is provided. The semiconductor device structure includes a semiconductor substrate and a conductive feature over the semiconductor substrate. The semiconductor device structure also includes a dielectric layer over the conductive feature and the semiconductor substrate. The semiconductor device structure further includes a conductive via surrounded by the dielectric layer and electrically connected to the conductive feature. The conductive via has a side surface extending from a topmost surface of the dielectric layer to a bottommost surface of the dielectric layer, and the side surface of the conductive via curves inward. An entirety of the side surface is in direct contact with the first dielectric layer.

20 Claims, 13 Drawing Sheets

(52) U.S. Cl.
CPC ............... *H01L 23/53295* (2013.01); *H01L 2924/0002* (2013.01)

(56) References Cited

U.S. PATENT DOCUMENTS

| | | |
|---|---|---|
| 8,716,117 B2 | 5/2014 | Kim et al. |
| 10,515,893 B2 * | 12/2019 | Peng ................ H01L 23/5226 |
| 2002/0182845 A1 | 12/2002 | Miyano et al. |
| 2003/0077894 A1 | 4/2003 | Ryu |
| 2007/0035026 A1 | 2/2007 | Su et al. |
| 2007/0126121 A1 * | 6/2007 | Shue ................ H01L 23/5226 |
| | | 257/774 |
| 2009/0014886 A1 | 1/2009 | Hsiao et al. |
| 2010/0052164 A1 * | 3/2010 | Lee ...................... H01L 24/03 |
| | | 257/738 |
| 2010/0164121 A1 | 7/2010 | Feustel et al. |
| 2010/0197133 A1 | 8/2010 | Werner et al. |
| 2010/0301486 A1 | 12/2010 | Frohberg et al. |
| 2012/0049345 A1 | 3/2012 | Railkar et al. |
| 2013/0267088 A1 | 10/2013 | Baek et al. |

\* cited by examiner

SEMICONDUCTOR DEVICE WITH DAMASCENE STRUCTURE

CROSS REFERENCE

This application is a Continuation application of U.S. patent application Ser. No. 16/225,316, filed on Dec. 19, 2018, which is a Continuation application of U.S. patent application Ser. No. 14/459,808, filed on Aug. 14, 2014, the entire of which are incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

One method used by the industry to meet the demands for device density is the adoption of damascene and dual-damascene structures for interconnect structures. In a damascene process, an underlying insulating layer is patterned with open trenches. Afterwards, a conductor is deposited and polished to the level of the insulating layer to form a patterned conductor feature. Dual-damascene processes use a similar approach and form and fill two features (a trench and a via hole) with a single deposition of conductor.

However, as the feature sizes shrink further and density requirements increase, the pitch between features, such as interconnect structures, decreases. As a result, fabrication processes continue to become more difficult to perform. It is a challenge to form interconnect structures with shorter and shorter pitches in a semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
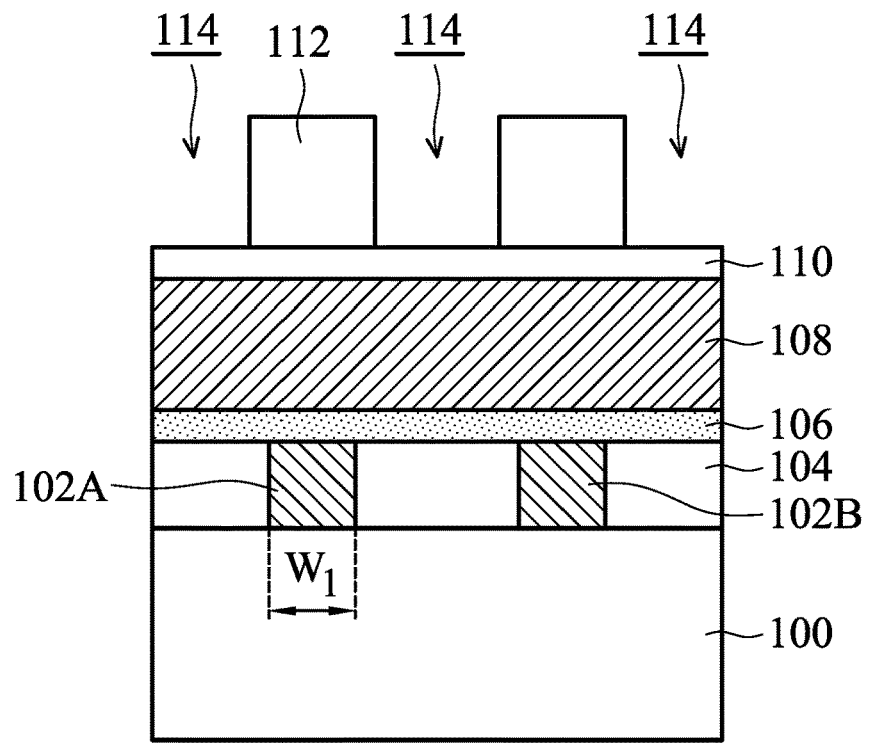
FIGS. 1A-1M are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1M are cross-sectional views of various stages of a process for forming a semiconductor device structure, in accordance with some embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A, conductive features 102A and 102B are formed over the semiconductor substrate 100. In some embodiments, each of the conductive features 102A and 102B is a conductive line electrically connected to a corresponding device element. For example, conductive contacts (not shown) are used to form electrical connections between the device elements and the conductive features.

In some embodiments, the conductive features 102A and 102B are made of copper, aluminum, gold, titanium, another suitable conductive material, or a combination thereof. Each of the conductive features 102A and 102B has a width $W_1$. In some embodiments, the width $W_1$ is in a range from about 7 nm to about 20 nm. In some embodiments, the width $W_1$ is a minimum line width of conductive lines in the semiconductor device structure.

In some embodiments, an insulating layer 104 is formed over the semiconductor substrate 100, as shown in FIG. 1A. In some embodiments, the insulating layer 104 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. Various processes, including deposition, etching, planarization, or the like, may be used to form the conductive features 102A and 102B and the insulating layer 104.

As shown in FIG. 1A, an etch stop layer 106 is deposited over the insulating layer 104 and the conductive features 102A and 102B, in accordance with some embodiments. The etch stop layer 106 is used to protect the conductive features 102A and 102B and the insulating layer 106 from being damaged during subsequent etching processes.

In some embodiments, the etch stop layer 106 is made of silicon carbide (SiC), silicon carbo-nitride (SiCN), silicon oxycarbide (SiCO), silicon nitride (SiN), silicon oxynitride (SiON), another suitable material, or a combination thereof. In some embodiments, the etch stop layer 106 is deposited using a chemical vapor deposition (CVD) process, a spin-on process, another applicable process, or a combination thereof. Embodiments of the disclosure have many variations. In some other embodiments, the etch stop layer 106 is not formed.

As shown in FIG. 1A, a dummy layer 108 is deposited over the semiconductor substrate 100 and the conductive features 102A and 102B, in accordance with some embodiments. In some embodiments, the dummy layer 108 is made of a material having a high etching selectivity to a subsequently formed dielectric layer. For example, the dummy layer 108 is made of a metal-containing material. The metal-containing material may include titanium nitride, titanium, tantalum, tantalum nitride, tungsten, another suitable material, or a combination thereof.

In some embodiments, the dummy layer 108 includes multiple stacked layers. The multiple stacked layers may be made of the same material. Alternatively, some of the stacked layers are made of different materials. In some embodiments, the dummy layer 108 is deposited by using a chemical vapor deposition (CVD) process, a physical vapor deposition (PVD) process, an electroplating process, an electroless plating process, another applicable process, or a combination thereof.

As shown in FIG. 1A, a cap layer 110 is deposited over dummy layer 108. The cap layer 110 is used to protect the underlying dummy layer 108 during subsequent etching processes. In some embodiments, the cap layer 110 is made of silicon oxide, silicon nitride, silicon oxynitride, silicon carbide, silicon boride, another suitable material, or a combination thereof.

In some embodiments, the cap layer 110 is a single layer. However, embodiments of the disclosure are not limited thereto. In some other embodiments, the cap layer 110 includes a stack of multiple layers. For example, the multiple layers are made of the same material. Alternatively, some of the multiple layers are made of different materials. In some embodiments, the cap layer 110 is deposited by using a CVD process, a PVD process, a spin-on process, another applicable process, or a combination thereof.

As shown in FIG. 1A, a photoresist layer 112 is formed over the cap layer 110, in accordance with some embodiments. In some embodiments, the photoresist layer 112 is patterned to form trenches 114. The trenches 114 divide the photoresist layer 112 into multiple separate island elements. A photolithography process is used to form the photoresist layer 112. The photolithography process may include photoresist coating (e.g., spin-on coating), soft baking, mask aligning, exposure, post-exposure baking, developing the photoresist, rinsing, drying (e.g., hard baking), another suitable operation, or a combination thereof.

Figure 1B:
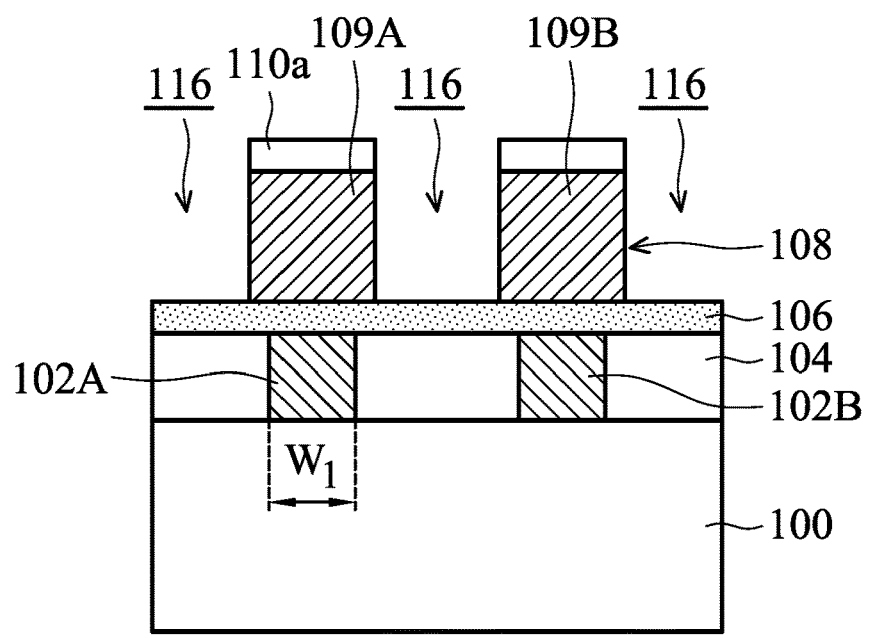

As shown in FIG. 1B, the cap layer 110 is partially removed to form cap elements 110a, in accordance with some embodiments. In some embodiments, the cap layer 110 is etched through the trenches 114 of the photoresist layer 112. As a result, the pattern of the photoresist layer 112 is substantially transferred to the cap layer 110 to form the cap elements 110a. In some embodiments, the photoresist layer 112 is removed after the formation of the cap elements 110a, as shown in FIG. 1B. The photoresist layer 112 may be removed using an ashing process, a wet striping process, another applicable process, or a combination thereof.

As shown in FIG. 1B, the dummy layer 108 is partially removed to form multiple dummy elements including dummy elements 109A and 109B, in accordance with some embodiments. In some embodiments, the cap elements 110a are used as an etching mask, and the dummy layer 108 is etched to form trenches 116. As a result, the dummy elements 109A and 109B are formed. The trenches 116 separate the dummy elements from each other. In some embodiments, the dummy layer 108 is etched by using a dry etching process, a wet etching process, or a combination thereof.

The dummy elements 109A and 109B are positioned over the conductive features 102A and 102B, respectively. In some embodiments, each of the dummy elements 109A and 109B has a substantially circular shape from the top view. In some other embodiments, each of the dummy elements 109A and 109B has a substantially oval shape from the top view. However, embodiments of the disclosure are not limited thereto. The dummy element may have another suitable shape from the top view. For example, the dummy element has a substantially rectangular top-view shape. Alternatively, the dummy element has a substantially square top-view shape.

Figure 1C:
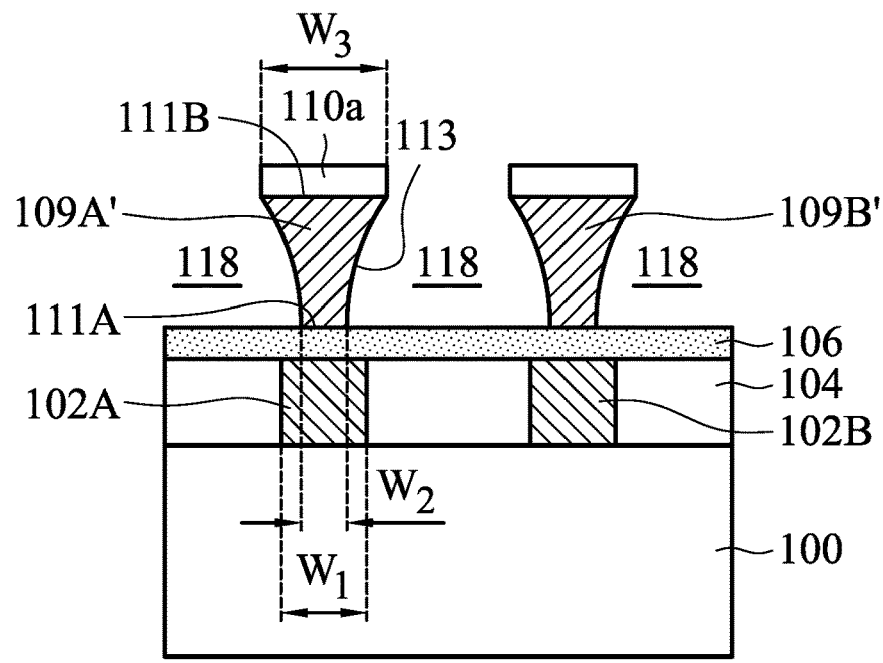

As shown in FIG. 1C, the dummy elements 109A and 109B are partially removed to form modified dummy elements 109A' and 109B', in accordance with some embodiments. After the partial removal of the dummy elements 109A and 109B, the trenches 116 are enlarged to form recesses 118. The recesses 118 surround the modified dummy elements 109A' and 109B'.

In some embodiments, the modified elements 109A' and 109B' have substantially the same shape and profile. As shown in FIG. 1C, the modified dummy element 109A' has a lower end 111A and an upper end 111B. In some embodiments, widths of the lower end 111A and the upper end 111B are different. In some embodiments, the upper end 111B is larger than the lower end 111A.

As shown in FIG. 1C, the upper end 111B of the modified element 109A' has a width $W_3$. The lower end 111A of the modified dummy element 109A' has a width $W_2$. In some embodiments, the width $W_3$ is greater than the width $W_2$. The width $W_3$ may be in a range from about 8 nm to about 26 nm. The width $W_2$ may be in a range from about 5 nm to about 18 nm. In some embodiments, the ratio of the widths $W_3$ to $W_2$ ($W_3/W_2$) is in a range from about 1.3 to about 2.6.

In some embodiments, widths of the modified dummy element 109A' gradually decrease along a direction from the upper end 111B to the lower end 111A. In some embodiments, the modified dummy element 109A' has a side surface 113 which is curved inward, as shown in FIG. 1C. The center of curvature of the side surface 113 is positioned outside of the modified dummy element 109A'.

In some embodiments, an etching process is used to partially remove the dummy elements 109A and 109B. For example, a dry etching process is performed. During the etching process, the cap elements 110a are used as protective caps to protect the underlying dummy elements 109A and 109B. By adjusting the conditions of the etching process, the etchant may mainly attack lower portions of the dummy elements. As a result, the modified dummy elements 109A' and 109B' having the desired profiles, such as those shown in FIG. 1C, are formed.

In some embodiments, the conditions of the etching process is adjusted to ensure that the lower end 111A of the modified dummy element 109A' is positioned directly above the conductive feature 102A. The width $W_2$ of the lower end 111A is controlled to be smaller than the width $W_1$ of the conductive feature 102A. Therefore, the alignment between the conductive feature 102A and the lower end 111A of the modified dummy element 109A' may be achieved more easily. In some embodiments, the ratio of the width $W_2$ to the width $W_1$ is in a range from about 0.5 to about 0.8. In some other embodiments, the width ratio ($W_2/W_1$) is in a range from about 0.4 to about 0.9.

In some embodiments, the dummy elements 109A and 109B are etched in a process chamber in which the pressure is in a range from about 1.5 mTorr to about 300 mTorr. In some embodiments, a gas or a mixture of gas is used for forming a suitable reaction gas. The gas or mixture of gas may include $Cl_2$, $O_2$, $N_2$, $CF_4$, $CHF_3$, $CH_2F_2$, $CH_3F$, $CH_4$, $NF_3$, $BCl_3$, HBr, Ar, He, another suitable gas, or a combination thereof. In some embodiments, the gas flow of the reaction gas is in a range from about 40 sccm to about 300 sccm. In some embodiments, a top source voltage and a bias voltage are used to assist in the etching back process. The top source voltage may be in a range from about 150V to about 1500V. The bias voltage may be in a range from about 5V to about 300V. In some other embodiments, the bias voltage is not applied. In some embodiments, the reaction temperature is in a range from about 10 degrees C. to about 60 degrees C.

Figure 1D:
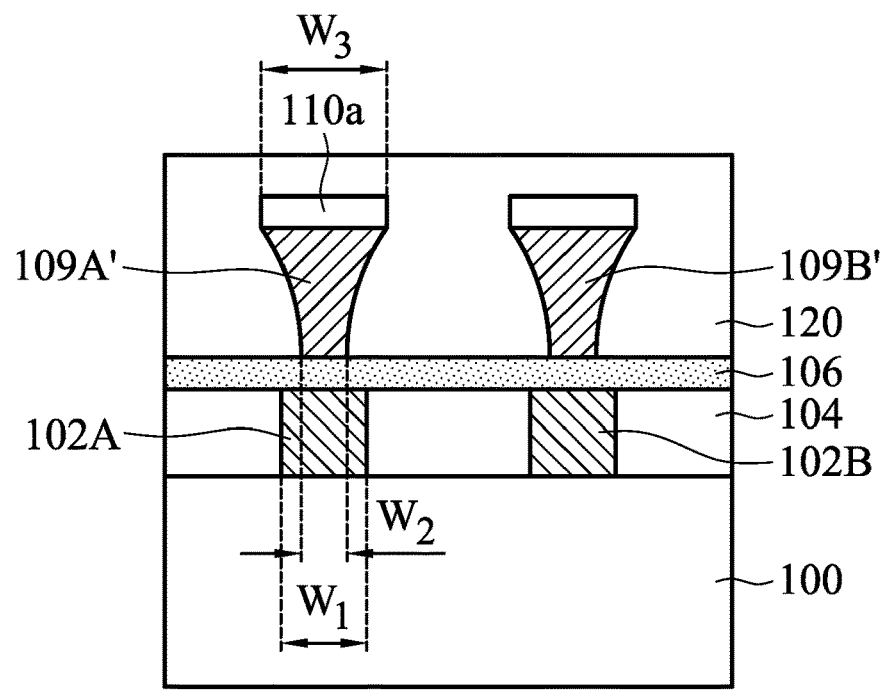

As shown in FIG. 1D, a dielectric layer 120 is deposited over the semiconductor substrate 100 to surround or cover the modified dummy elements 109A' and 109B', in accordance with some embodiments. The dielectric layer 120 serves as an inter-metal dielectric (IMD) layer. In some embodiments, the dielectric layer 120 is made of a low-k dielectric material. The low-k dielectric material has a dielectric constant smaller than that of silicon dioxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 104 is helpful for reducing the RC delay.

In some embodiments, the dielectric layer 120 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 120 includes a material including Si, C, O, or H. For example, the dielectric layer 120 includes $SiO_2$, SiOC, SiON, SiCOH, SiOCN, or a combination thereof. In some embodiments, the dielectric layer 120 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 120 includes fluorine-doped silicate glass (FSG) such as fluorine-doped —(O—Si$(CH_3)_2$—O)—. In some embodiments, the dielectric layer 120 is deposited using a CVD process, a spin-on process, a spray coating process, another applicable process, or a combination thereof.

Figure 1E:
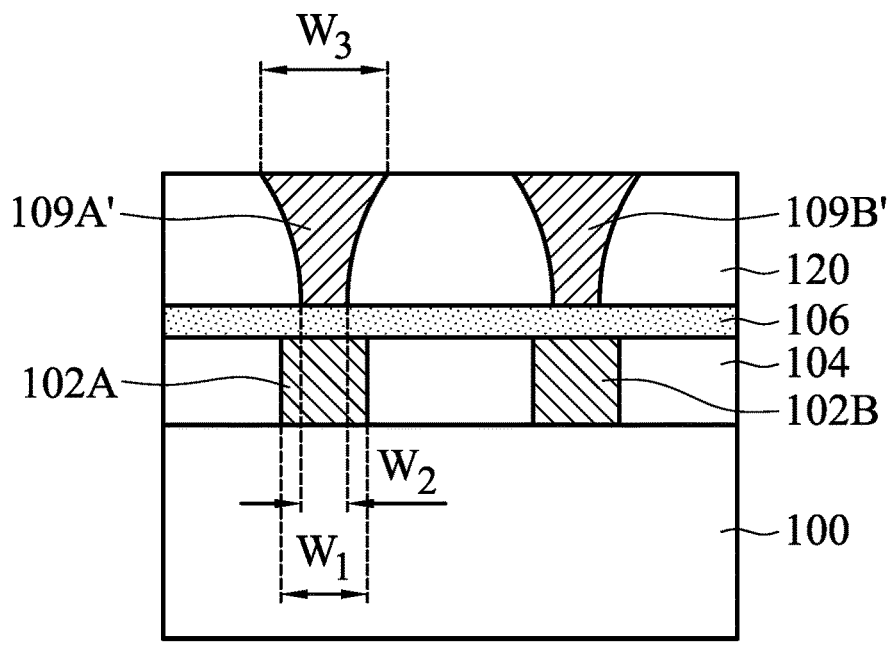

As shown in FIG. 1E, the dielectric layer 120 is planarized until the modified dummy elements 109A' and 109B' are exposed, in accordance with some embodiments. In some embodiments, the cap elements 110a are also removed after the planarization of the dielectric layer 120. After the planarization of the dielectric layer 120, the top surface of the dielectric layer 120 is substantially coplanar with the top surfaces of the modified dummy elements 109A' and 109B'. In some embodiments, the dielectric layer 120 is planarized by using a chemical mechanical polishing (CMP) process, a grinding process, an etching process, another applicable process, or a combination thereof.

Figure 1F:
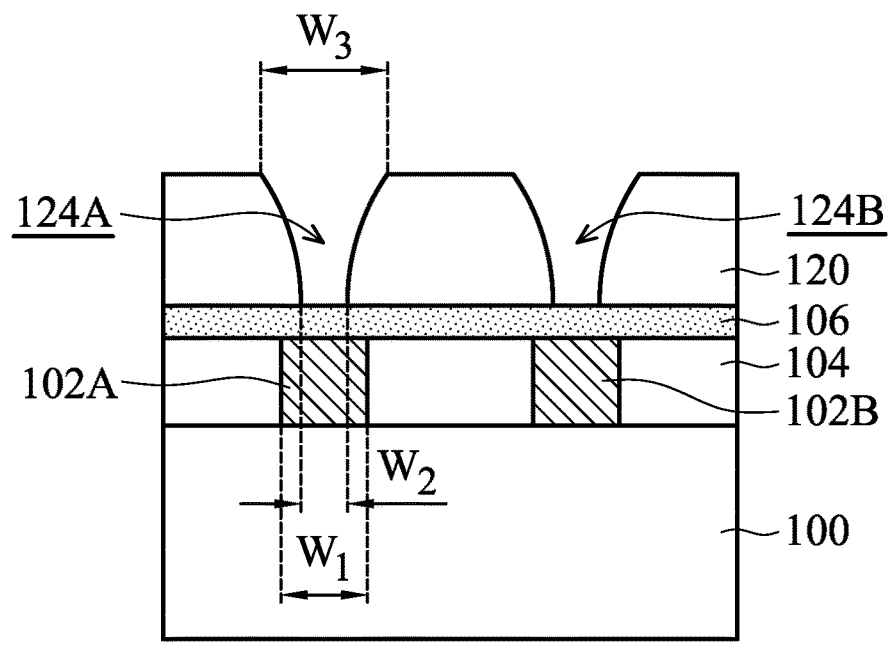

As shown in FIG. 1F, the modified dummy elements 109A' and 109B' are removed to form recesses 124A and 124B in the dielectric layer 120, in accordance with some embodiments. In some embodiments, the recesses 124A and 124B expose the etch stop layer 106 which is originally covered by the modified dummy elements 109A' and 109B'. The recesses 124A and 124B have profiles substantially the same as those of the modified dummy elements 109A' and 109B'. As shown in FIG. 1F, the recesses 124A and 124B have curved sidewall surfaces and a larger top opening, which assist in a subsequent filling process for forming conductive vias.

In some embodiments, an etching process is used to remove the modified dummy elements 109A' and 109B'. In some embodiments, to keep the profiles of the recesses 124A and 124B substantially the same as those of the modified dummy elements 109A' and 109B', a wet etching process is used to form the recesses 124A and 124B. However, embodiments of the disclosure are not limited thereto. In some other embodiments, a dry etching process is performed to form the recesses 124A and 124B. Alternatively, in some other embodiments, a dry etching process and a wet etching process are used in combination to form the recesses 124A and 124B.

Figure 1G:
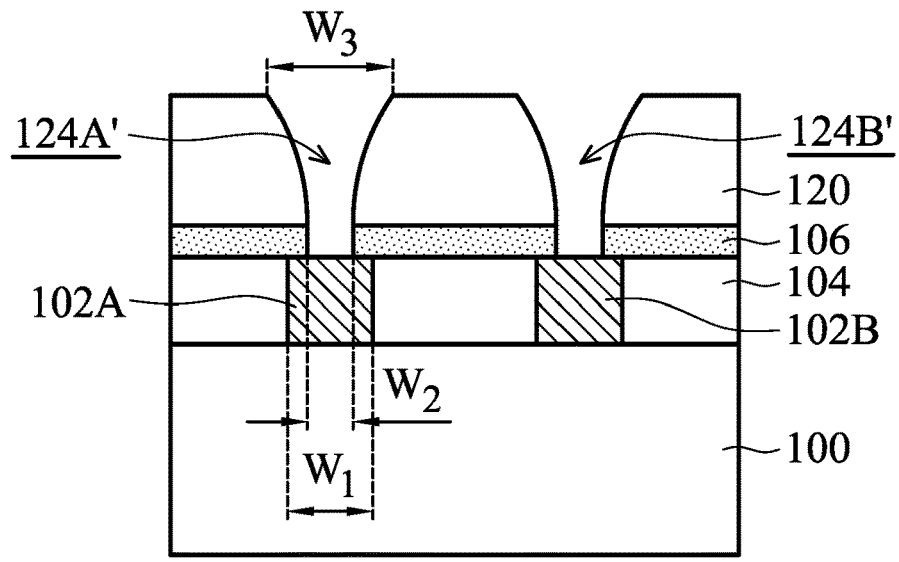

As shown in FIG. 1G, the etch stop layer 106 is removed through the recesses 124A and 124B to expose the conductive features 102A and 102B, in accordance with some embodiments. The recesses 124A and 124B are extended downward to form recesses 124A' and 124B'. In some embodiments, a dry etching process is used to partially remove the etch stop layer 106 and expose the conductive features 102A and 102B.

The recesses 124A' and 124B' serve as via holes. In some embodiments, after a subsequent filling process of conductive materials, conductive vias are formed in the recesses 124A' and 124B'. Referring to FIG. 1C, since the lower end 111A of the modified dummy element 109A' is aligned with the conductive feature 102A, the associated recess 124A' formed by removing the modified dummy element 109A' is also aligned with the conductive feature 102A. Similarly, another recess, such as the recess 124B', is aligned with the corresponding conductive feature, such as the conductive feature 102B. Each of the via holes is therefore aligned with the corresponding conductive feature.

Figure 1H:
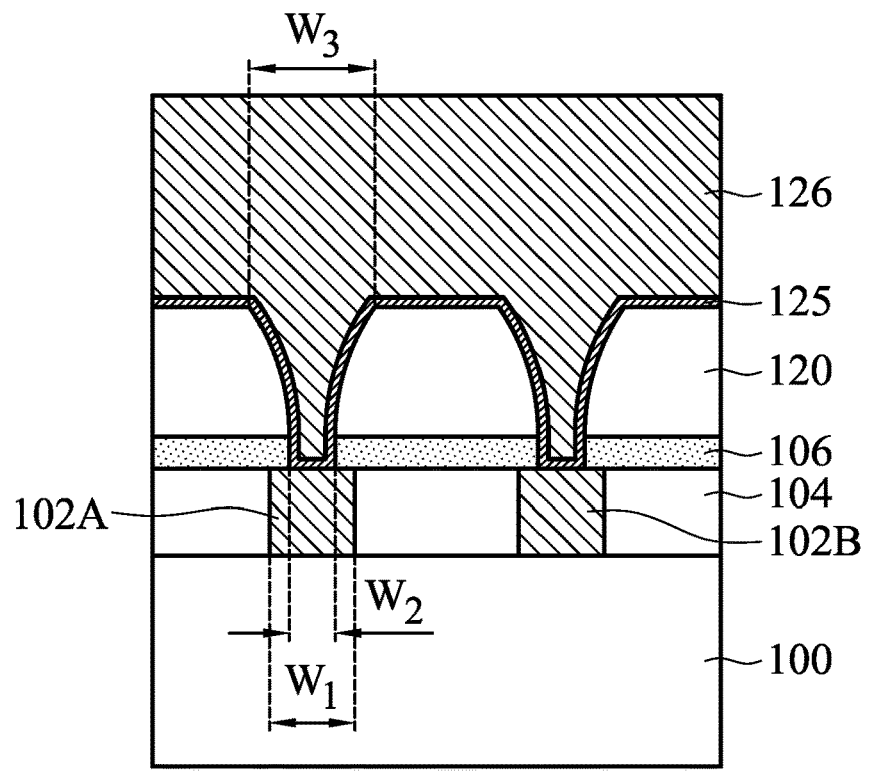

Afterwards, one or more conductive materials are deposited to fill the via holes such as the recesses 124A' and 124B'. As shown in FIG. 1H, a conductive layer 126 is deposited over the dielectric layer 120 to fill the recesses 124A' and 124B', in accordance with some embodiments. Each of the recesses 124A' and 124B' has a relative large top opening and a curved sidewall surface. The profiles of the recesses 124A' and 124B' facilitate the deposition of the conductive layer 126.

In some embodiments, the conductive layer 126 is made of copper, cobalt, aluminum, tungsten, titanium, nickel, gold, platinum, another suitable conductive material, or a combination thereof. In some embodiments, the conductive layer 126 is deposited using an electrochemical plating process, an electroless plating process, a PVD process, a CVD process, a spin-on process, another applicable process, or a combination thereof.

As shown in FIG. 1H, a seed layer 125 is deposited over the dielectric layer 120 before the conductive layer 126 is deposited, in accordance with some embodiments. In some embodiments, the seed layer 125 is conformally formed over sidewalls and bottoms of the recesses 124A' and 124B'. The seed layer 125 is used to assist in the formation of the conductive layer 126.

In some embodiments, the seed layer 125 is made of copper or copper alloy. In some embodiments, the seed layer 125 includes copper, silver, gold, titanium, aluminum, tungsten, another suitable material, or a combination thereof. In some embodiments, the seed layer 125 is deposited by using a PVD process, a CVD process, another applicable process, or a combination thereof. Embodiments of the disclosure have many variations. In some other embodiments, the seed layer 125 is not formed.

In some embodiments, before the seed layer 125 and the conductive layer 126 are deposited, a barrier layer (not shown) is deposited over the dielectric layer 120. The barrier layer is used to protect the dielectric layer 120 from diffusion of a metal material from the seed layer 125 and the conductive layer 126 sequentially formed. In some embodiments, the barrier layer is made of titanium, tantalum nitride, titanium nitride, tungsten nitride, another suitable material, or a combination thereof. In some embodiments, the barrier layer is deposited using a PVD process, a CVD process, another applicable process, or a combination thereof.

Figure 1I:
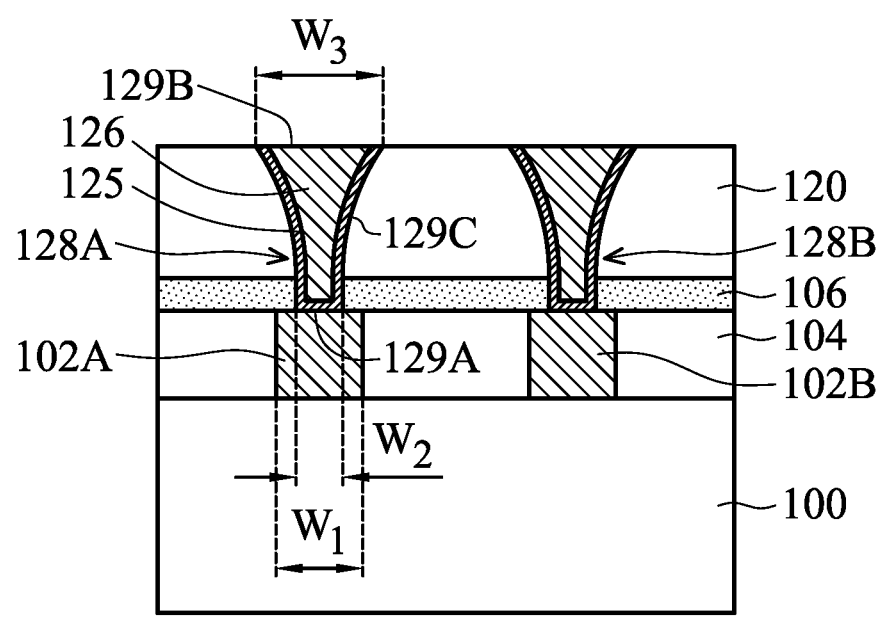

As shown in FIG. 1I, a planarization process is performed to thin down the conductive layer 126 until the dielectric layer 120 is exposed, in accordance with some embodiments. The conductive layer 126 and the seed layer 125 outside of the recesses 124A' and 124B' are removed after the planarization process. As a result, a damascene structure including the conductive vias 128A and 128B is formed.

In some embodiments, each of the conductive vias 128A and 128B includes a portion of the conductive layer 126 and a portion of the seed layer 125. Each of the conductive vias 128A and 128B may further include a portion of the barrier layer if it is formed. In some embodiments, the planarization process includes a chemical mechanical polishing (CMP) process, a mechanical grinding process, an etching process, another applicable process, or a combination thereof.

As shown in FIG. 1I, each of the conductive vias 128A and 128B has a lower end 129A and an upper end 129B. In some embodiments, widths of the lower end 129A and the upper end 129B are different. In some embodiments, the upper end 129B is larger than the lower end 129A. The width of the upper end 129B is substantially equal to the width $W_3$ of the upper end 111B, and the width of the lower end 129A is substantially equal to the width $W_2$ of the lower end 111A.

As mentioned above, the width $W_3$ may be in a range from about 8 nm to about 26 nm. The width $W_2$ may be in a range from about 5 nm to about 18 nm. The ratio of the widths $W_3$ to $W_2$ ($W_3/W_2$) is in a range from about 1.3 to about 2.6. The lower end 129A has a relatively small area to ensure that a good alignment between the conductive via and the underlying conductive feature is established. The upper end 129B has a relatively large area to provide a larger landing area for a subsequently formed conductive line.

In some embodiments, the widths of the conductive vias 128A and 128B gradually decrease along a direction from the upper end 129B to the lower end 129A. In some embodiments, the conductive via 128A has a side surface 129C which is curved inward, as shown in FIG. 1I. The center of curvature of the side surface 129C is positioned outside of the conductive via 128A. In some embodiments, the conductive via 128B has a profile similar to that of the conductive via 128A.

Figure 1J:
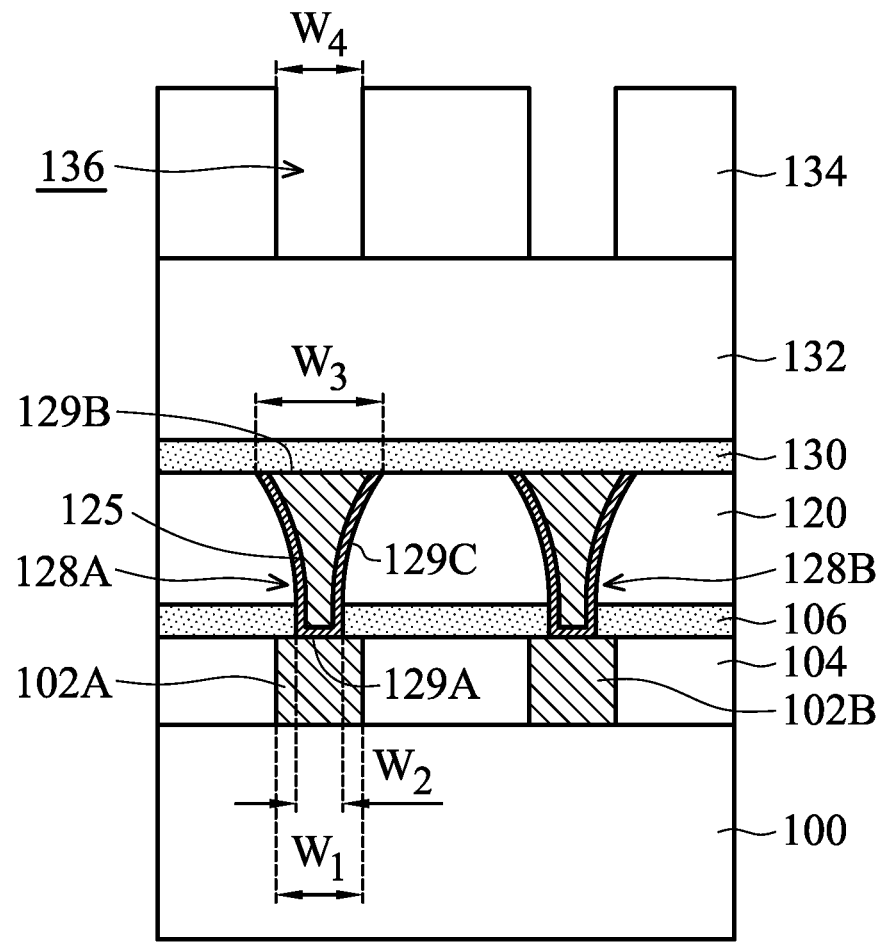

As shown in FIG. 1J, an etch stop layer 130 is deposited over the dielectric layer 120 and the conductive vias 128A and 128B, in accordance with some embodiments. The etch stop layer 130 is used to protect the dielectric layer 120 and the conductive vias 128A and 128B from being damaged during a subsequent trench etching process.

In some embodiments, the etch stop layer 130 is made of silicon carbide (SiC), silicon carbo-nitride (SiCN), silicon oxycarbide (SiCO), silicon nitride (SiN), silicon oxynitride (SiON), another suitable material, or a combination thereof. In some embodiments, the etch stop layer 130 is deposited using a chemical vapor deposition (CVD) process, a spin-on process, another applicable process, or a combination thereof. Embodiments of the disclosure are not limited thereto. In some other embodiments, the etch stop layer 130 is not formed.

As shown in FIG. 1J, a dielectric layer 132 is deposited over the etch stop layer 130, in accordance with some embodiments. In some embodiments, the material and formation method of the dielectric layer 132 are similar to those of the dielectric layer 120. For example, the dielectric layer 132 is made of a low-k dielectric material.

As shown in FIG. 1J, a photoresist layer 134 is formed over the dielectric layer 132, in accordance with some embodiments. In some embodiments, the photoresist layer 134 is patterned to form trench openings 136. The trench openings 136 form a trench pattern which will be transferred to the dielectric layer 132.

Each of the trench openings 136 has a width $W_4$. In some embodiments, the width $W_4$ is smaller than the width $W_3$ of the upper end 129a of the conductive via 128A or 128B. In some embodiments, the width $W_4$ is in a range from about 7 nm to about 20 nm. In some embodiments, the width $W_4$ is substantially equal to the width $W_1$ of the conductive feature 102A or 102B. Embodiments of the disclosure have many variations and are not limited to the above-mentioned embodiments. In some embodiment, the width $W_4$ is larger than the width $W_1$ or $W_3$.

A photolithography process is used to form the photoresist layer 134. The photolithography process may include photoresist coating (e.g., spin-on coating), soft baking, mask aligning, exposure, post-exposure baking, developing the photoresist, rinsing, drying (e.g., hard baking), another suitable operation, or a combination thereof. Each of the trench openings 136 is aligned with a corresponding conductive via such as the conductive via 128A or 128B.

Because the conductive via 128A or 128B has a relatively large top end, the trench opening 136 can be aligned with the conductive via 128A or 128B more easily. In other words, the top end 129B is a relatively large target for the trench opening 136 to aim at. The overlay margin is therefore enlarged.

Figure 1K:
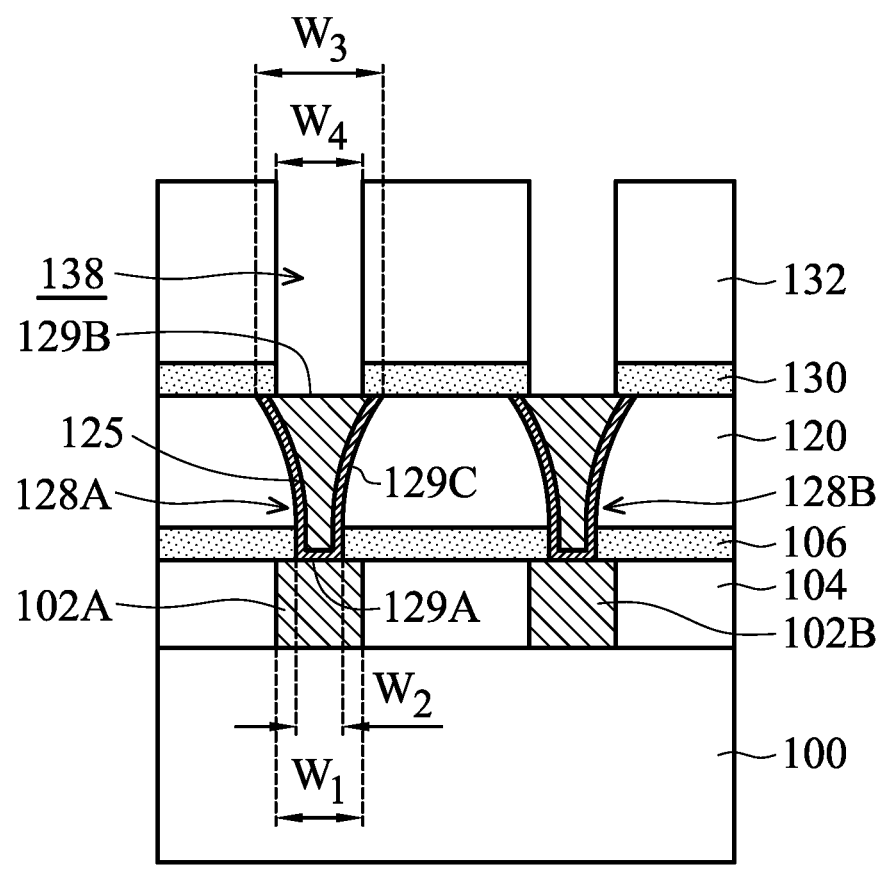

As shown in FIG. 1K, the dielectric layer 132 is etched through the trench openings 136 of the photoresist layer 134 to form trenches 138, in accordance with some embodiments. Afterwards, the etch stop layer 130 under the trenches 138 is removed to expose the conductive vias 128A and 128B, as shown in FIG. 1K in accordance with some embodiments. In some embodiments, each of the trenches 138 also has the width $W_4$.

Embodiments of the disclosure have many variations. In some embodiments, the trench opening 136 of the photoresist layer 134 has a width larger than the width $W_4$. In some embodiments, the width of the trench opening 136 is in a range from about 35 nm to about 55 nm. During the dielectric layer 132 is etched through the trench openings 136, the etching condition is adjusted or tuned to assist in the formation of the trenches 138 with a smaller width. As a result, the trenches 138 with the width $W_4$ narrower than the width of the trench opening 136 are formed.

The photoresist layer 134 is removed in some embodiments. In some embodiments, each of the trenches 138 has a trench width which is substantially equal to the width $W_1$ of the conductive feature 102A or 102B. In some other embodiments, the trench width of the trench 138 is greater than the width $W_1$ of the conductive feature 102A or 102B. In some embodiments, the width $W_4$ is smaller than the width $W_3$. In some other embodiments, the width $W_4$ is greater than the width $W_3$.

Figure 1L:
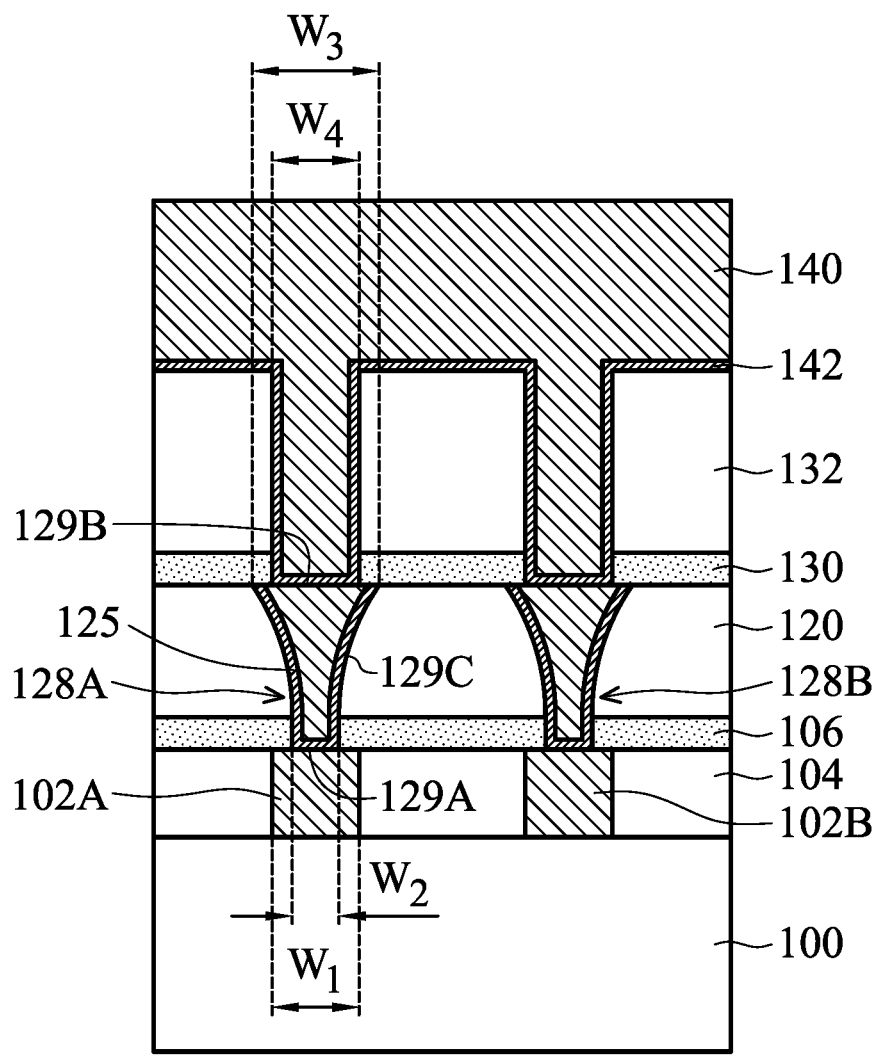

Afterwards, one or more conductive materials are deposited to fill the trenches 138. As shown in FIG. 1L, a conductive layer 140 is deposited over the dielectric layer 132 to fill the trenches 138, in accordance with some embodiments. In some embodiments, the conductive layer 140 is made of copper, cobalt, aluminum, tungsten, titanium, nickel, gold, platinum, another suitable conductive material, or a combination thereof. In some embodiments, the conductive layer 140 is deposited using an electrochemical plating process, an electroless plating process, a PVD process, a CVD process, a spin-on process, another applicable process, or a combination thereof.

As shown in FIG. 1L, a seed layer 142 is deposited over the dielectric layer 132 before the conductive layer 140 is deposited, in accordance with some embodiments. In some embodiments, the seed layer 142 is conformally formed over sidewalls and bottoms of the trenches 138. The seed layer 142 is used to assist in the formation of the conductive layer 140.

In some embodiments, the seed layer 142 is made of copper or copper alloy. In some embodiments, the seed layer 142 includes copper, silver, gold, titanium, aluminum, tungsten, another suitable material, or a combination thereof. In some embodiments, the seed layer 142 is deposited by using a PVD process, a CVD process, another applicable process, or a combination thereof. Embodiments of the disclosure have many variations. In some other embodiments, the seed layer 142 is not formed.

In some embodiments, before the seed layer 142 and the conductive layer 140 are deposited, a barrier layer (not shown) is deposited over the dielectric layer 132. The barrier layer is used to protect the dielectric layer 132 from diffusion of a metal material from the seed layer 142 and the conductive layer 140 sequentially formed. In some embodiments, the barrier layer is made of titanium, tantalum nitride, titanium nitride, tungsten nitride, another suitable material, or a combination thereof. In some embodiments, the barrier layer is deposited using a PVD process, a CVD process, another applicable process, or a combination thereof.

Figure 1M:
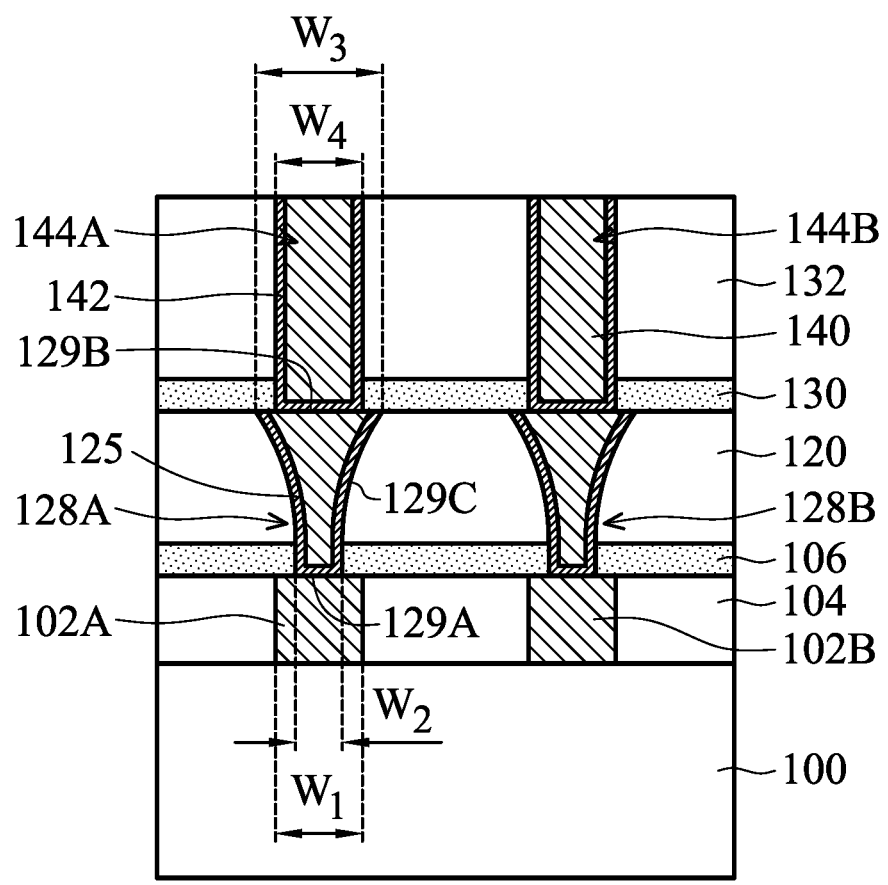

As shown in FIG. 1M, a planarization process is performed to thin down the conductive layer 140 until the dielectric layer 132 is exposed, in accordance with some embodiments. The conductive layer 140 and the seed layer 142 outside of the trenches 138 are removed after the planarization process. As a result, a damascene structure including the conductive lines 144A and 144B is formed.

In some embodiments, each of the conductive lines 144A and 144B includes a portion of the seed layer 142 and a portion of the conductive layer 140. Each of the conductive lines 144A and 144B may further include a portion of the barrier layer if it is formed. In some embodiments, the planarization process includes a chemical mechanical polishing (CMP) process, a mechanical grinding process, an etching process, another applicable process, or a combination thereof.

As shown in FIG. 1M, each of the conductive vias 128A and 128B has a funnel-like structure, in accordance with some embodiments. The funnel-like structure has a larger end (129B) and a smaller end (129A). The funnel-like structure has a side surface (129C) which is curved inward. The lower end 129A with the smaller width $W_2$ allows a good alignment between the conductive via 128A and the conductive feature 102A to be achieved more easily. Similarly, the alignment between the conductive via 128B and the conductive feature 102B is also achieved more easily. Contact areas between different conductive vias and different conductive features are similar. The upper end 129B with the wider width $W_3$ enables a subsequent formed conductive line to be aligned with the conductive via more easily. Contact areas between different conductive vias and different conductive lines are also similar. Therefore, the reliability and quality are improved due to the profile of the conductive via.

Embodiments of the disclosure have many variations. FIGS. 2A-2D are cross-sectional views of various stages of a process for forming a semiconductor device structure, in accordance with some embodiments.

Figure 2A:
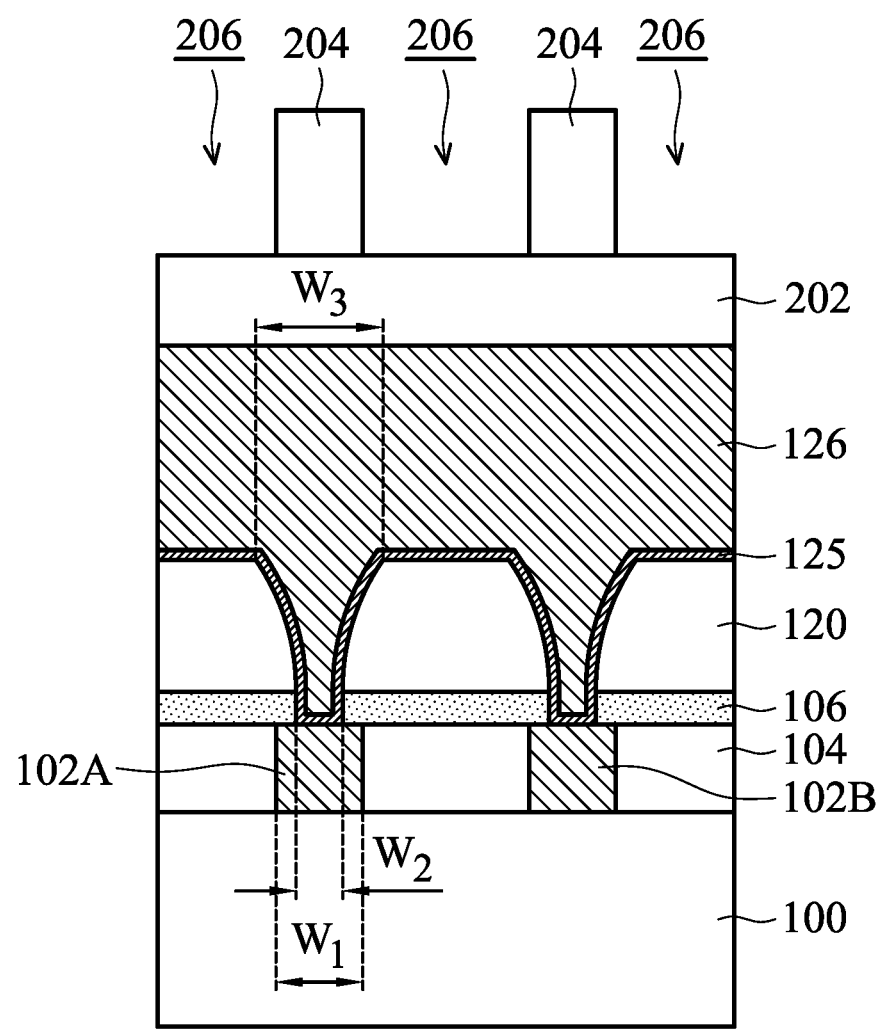
FIGS. 2A-2D are cross-sectional views of various stages of a process for forming a semiconductor device structure, in accordance with some embodiments.

As shown in FIG. 2A, a structure similar to that shown in FIG. 1H is provided, in accordance with some embodiments. In some embodiments, a planarization process is performed to provide the conductive layer 126 a substantially planar surface. In some embodiments, the planarization process includes a CMP process, a grinding process, an etching process, another applicable process, or a combination thereof.

Afterwards, a hard mask layer 202 and a photoresist layer 204 are formed over the conductive layer 126, as shown in FIG. 2A in accordance with some embodiments. The photoresist layer 204 has openings 206. The photoresist layer 204 is used to assist in subsequent formation of conductive lines.

In some embodiments, the hard mask layer 202 is made of titanium, titanium nitride, tantalum, tantalum nitride, tungsten, another suitable material, or a combination thereof. In some other embodiments, the hard mask layer 202 is made of silicon nitride, silicon oxynitride, polymeric carbon, graphitic carbon, silicon carbide, titanium oxide, silicon, another suitable material, or a combination thereof. In some embodiments, the hard mask layer 202 includes multiple stacked layers. The multiple stacked layers may be made of the same material. Alternatively, some of the stacked layers are made of different materials.

Figure 2B:
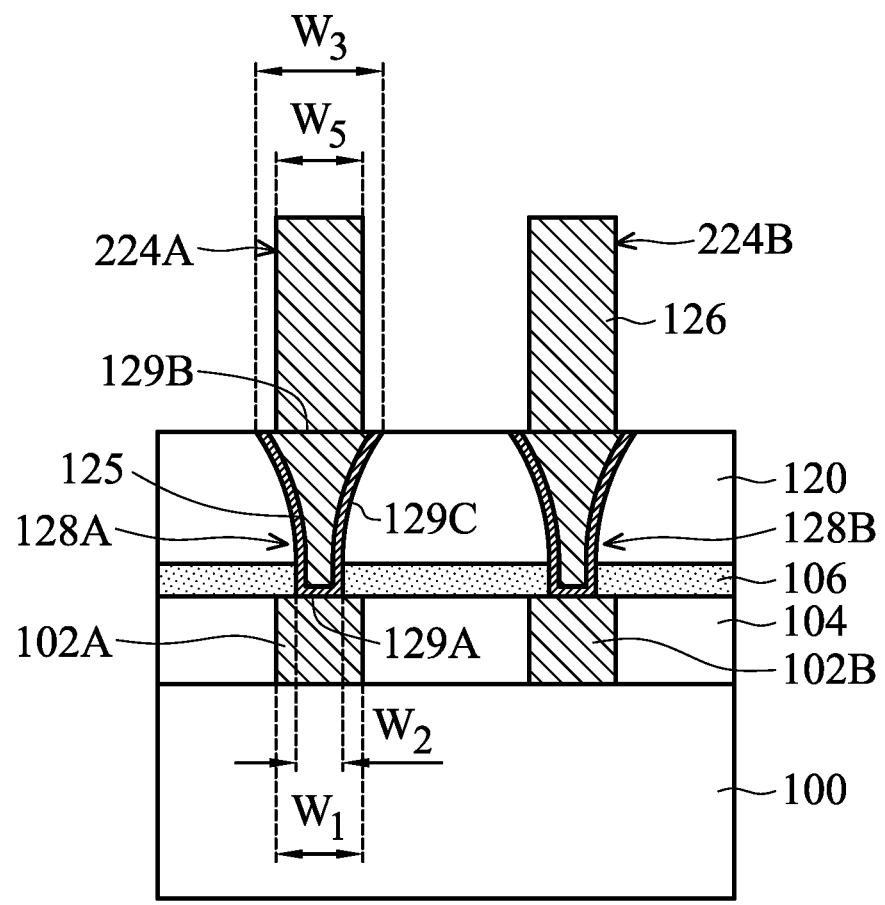

As shown in FIG. 2B, the conductive layer 126 is partially removed, in accordance with some embodiments. The portions of the conductive layer 126 above the dielectric layer 120 form multiple conductive lines including conductive lines 244A and 244B. The portions of the conductive layer 126 surrounded by the dielectric layer 120 form multiple conductive vias including conductive vias 128A and 128B.

In some embodiments, the pattern of the openings 206 is transferred to the hard mask layer 202 by using an etching process so as to form a patterned hard mask (not shown). Afterwards, the patterned hard mask is used as an etching mask, and the conductive layer 206 is etched. As a result, the conductive lines 244A and 244B and the conductive vias 128A and 128B are formed.

In some embodiments, the conductive line 244A and the conductive via 128A is a single piece. No intermediate layer is formed between the conductive line 244 and the conductive via 128A. Similarly, the conductive line 244B and the conductive via 128B are also a single piece. In some embodiments, there is no seed layer or barrier layer formed between the conductive via 128A and the conductive line 224A. Since the conductive via and the conductive line are formed by patterning the same conductive layer, the alignment between the conductive via and the conductive line is ensured.

Similarly, each of the conductive vias 128A and 128B has the lower end 129A and the upper end 129B, as shown in FIG. 2B. The upper end 129B has the width $W_3$, and the lower end 129A has the width $W_2$. In some embodiments, the widths of the conductive vias 128A and 128B gradually decrease along a direction from the upper end 129B to the lower end 129A. In some embodiments, the side surface 129C of the conductive via 128A curves inward, as shown in FIG. 2B. The center of curvature of the side surface 129C is positioned outside of the conductive via 128A. In some embodiments, the conductive via 128B has a profile similar to that of the conductive via 128A. Each of the conductive lines 244A and 244B has a line width $W_5$, as shown in FIG. 2B. The width $W_3$ is greater than the width $W_5$. In some embodiments, the width $W_5$ is in a range from about 7 nm to about 20 nm.

Figure 2C:
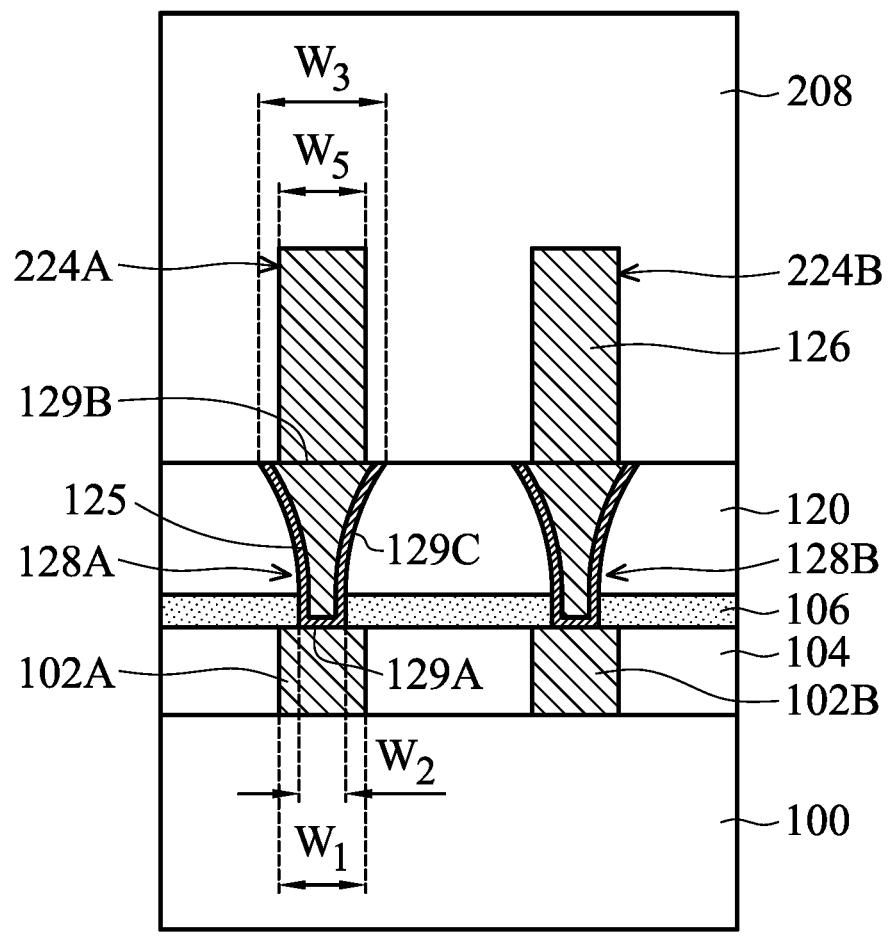
Figure 2D:
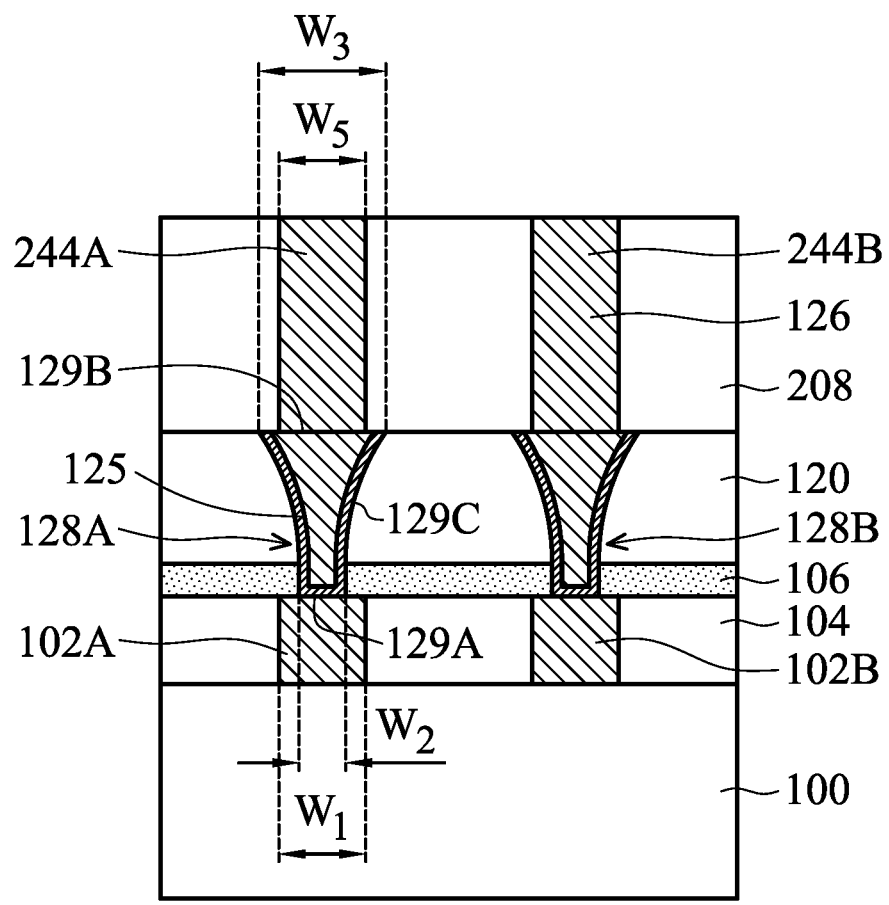

As shown in FIG. 2C, a dielectric layer 208 is deposited over the dielectric layer 120 and the conductive lines 244A and 244B, in accordance with some embodiments. In some embodiments, the material and formation method of the dielectric layer 208 are similar to those of the dielectric layer 120. For example, the dielectric layer 208 is made of a low-k dielectric material. Afterwards, the dielectric layer 208 is thinned down until the conductive lines 244A and 244B are exposed, as shown in FIG. 2D in accordance with some embodiments. In some embodiments, the dielectric layer 208 is thinned using a CMP process, a grinding process, an etching process, another applicable process, or a combination thereof.

Embodiments of the disclosure provide mechanisms for forming a semiconductor device structure with damascene structures. Dummy elements with a funnel-like structure are formed over a semiconductor substrate. The dummy elements are removed after a dielectric layer is deposited over the semiconductor substrate. As a result, recesses having a funnel-like profile are formed. The recesses are filled with one or more conductive materials to form conductive vias. Each of the conductive vias also has a funnel-like profile. The lower end of each conductive via has a smaller area which allows a good alignment between the conductive via and an underlying conductive feature. The upper end of each conductive via has a larger area which enables a subsequently formed conductive line to be aligned with the conductive via more easily.

In accordance with some embodiments, a semiconductor device structure is provided. The semiconductor device structure includes a semiconductor substrate and a conductive feature over the semiconductor substrate. The semiconductor device structure also includes a dielectric layer over the conductive feature and the semiconductor substrate. The semiconductor device structure further includes a conductive via surrounded by the dielectric layer and electrically connected to the conductive feature. The conductive via has a lower end and an upper end larger than the lower end, and the conductive via has a side surface curved inward.

In accordance with some embodiments, a semiconductor device structure is provided. The semiconductor device structure includes a semiconductor substrate and a conductive feature over the semiconductor substrate. The semiconductor device structure also includes a first dielectric layer over the conductive feature and the semiconductor substrate and a second dielectric layer over the first dielectric layer. The semiconductor device structure further includes a conductive via embedded in the first dielectric layer and electrically connected to the conductive feature. The conductive via has a lower end and an upper end, widths of the lower end and the upper end are different, and the conductive via has a side surface curved inward. In addition, the semiconductor device structure includes a conductive line embedded in the second dielectric layer and electrically connected to the conductive via.

In accordance with some embodiments, a method for forming a semiconductor device structure is provided. The method includes providing a semiconductor substrate with a conductive feature formed over the semiconductor substrate. The method also includes forming a dummy element over the conductive feature and partially removing the dummy element to form a modified dummy element. The modified dummy element has a lower end and an upper end larger than the lower end, and the modified dummy element has a side surface curved inward. The method further includes forming a dielectric layer over the semiconductor substrate to surround the modified dummy element. In addition, the method includes forming a dielectric layer over the semiconductor substrate to surround the modified dummy element and forming a conductive via in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a conductive feature over the semiconductor substrate;
   a first dielectric layer over the conductive feature and the semiconductor substrate, wherein the first dielectric layer is made of silicon oxide, carbon-containing silicate glass, hydrogen-containing silicate glass, fluorine-containing silicate glass, or a combination thereof, and the first dielectric layer extends across edges of the conductive feature; and
   a conductive via surrounded by the first dielectric layer and electrically connected to the conductive feature, wherein the conductive via has a lower end and an upper end, widths of the conductive via gradually decrease along a direction from the upper end to the lower end, the conductive via has a side surface curving inward, and an entirety of the side surface is in direct contact with the first dielectric layer.

2. The semiconductor device structure as claimed in claim 1, wherein the conductive via comprises a first seed layer and a first conductive layer, and the first seed layer is between the first conductive layer and the first dielectric layer.

3. The semiconductor device structure as claimed in claim 2, further comprising:
   a second dielectric layer over the first dielectric layer; and
   a conductive line surrounded by the second dielectric layer and electrically connected to the conductive via.

4. The semiconductor device structure as claimed in claim 3, wherein the upper end of the conductive via has a width greater than a line width of the conductive line.

5. The semiconductor device structure as claimed in claim 3, further comprising an etch stop layer between the first dielectric layer and the second dielectric layer.

6. The semiconductor device structure as claimed in claim 5, wherein:
   the first seed layer surrounds a sidewall and a bottom of the first conductive layer,
   the conductive line comprises a second seed layer and a second conductive layer,
   the second seed layer surrounds a sidewall and a bottom of the second conductive layer, and
   the second seed layer physically separates the first conductive layer from the second conductive layer.

7. The semiconductor device structure as claimed in claim 3, wherein the first dielectric layer is in direct contact with the second dielectric layer.

8. The semiconductor device structure as claimed in claim 7, wherein the conductive via and the conductive line are a single piece without any interface between the conductive via and the conductive line.

9. The semiconductor device structure as claimed in claim 3, wherein the conductive line has a line width substantially equal to a width of the conductive feature.

10. The semiconductor device structure as claimed in claim 1, wherein the upper end of the conductive via has a width larger than a line width of the conductive feature.

11. A semiconductor device structure, comprising:
    a semiconductor substrate;
    a conductive feature over the semiconductor substrate;
    a first dielectric layer over the conductive feature and the semiconductor substrate, wherein the first dielectric layer is made of silicon oxide, carbon-containing silicate glass, hydrogen-containing silicate glass, fluorine-containing silicate glass, or a combination thereof, and the first dielectric layer is wider than the conductive feature;
    a second dielectric layer over the first dielectric layer;
    a conductive via embedded in the first dielectric layer, wherein the conductive via has a lower end in contact with the conductive feature and an upper end, widths of the lower end and the upper end are different, the conductive via has a side surface extending from a topmost surface of the first dielectric layer to a bottommost surface of the first dielectric layer, the side surface of the conductive via curves inward, an entirety of the side surface is in direct contact with the first dielectric layer; and
    a conductive line embedded in the second dielectric layer and electrically connected to the conductive via.

12. The semiconductor device structure as claimed in claim 11, wherein the upper end of the conductive via has a width greater than a line width of the conductive line.

13. The semiconductor device structure as claimed in claim 11, wherein the conductive via and the conductive line are in direct contact with each other, and the conductive via and the conductive line are made of a same material.

14. The semiconductor device structure as claimed in claim 11, wherein the conductive via and the conductive line are a single piece without any interface between the conductive via and the conductive line.

15. A semiconductor device structure, comprising:
    a semiconductor substrate;
    a conductive feature over the semiconductor substrate;
    a dielectric layer over the conductive feature and the semiconductor substrate, wherein the dielectric layer is made of silicon oxide, carbon-containing silicate glass, hydrogen-containing silicate glass, fluorine-containing silicate glass, or a combination thereof, and the dielectric layer extends across opposite sidewalls of the conductive feature; and
    a conductive via surrounded by the first dielectric layer and electrically connected to the conductive feature, wherein the conductive via has a side surface extending from a topmost surface of the dielectric layer to a bottommost surface of the dielectric layer, an entirety of the side surface of the conductive via curves inward, and the entirety of the side surface is in direct contact with the first dielectric layer.

16. The semiconductor device structure as claimed in claim 15, wherein widths of the conductive via gradually decrease along a direction from the upper end to the lower end.

17. The semiconductor device structure as claimed in claim 15, further comprising:
    a second dielectric layer over the dielectric layer; and
    a conductive line surrounded by the second dielectric layer and electrically connected to the conductive via.

18. The semiconductor device structure as claimed in claim 17, wherein the upper end of the conductive via has a width greater than a line width of the conductive line.

19. The semiconductor device structure as claimed in claim 15, wherein the conductive via comprises a seed layer and a conductive layer, and the seed layer is between the conductive layer and the dielectric layer.

20. The semiconductor device structure as claimed in claim 19, wherein a top surface of the seed layer is substantially coplanar with a surface of the conductive layer.

* * * * *